United States Patent
Wu et al.

(10) Patent No.: US 12,117,510 B2
(45) Date of Patent: Oct. 15, 2024

(54) METHODS FOR MULTI-SLICE AND MULTI-CONTRAST MAGNETIC RESONANCE IMAGING WITH JOINT IMAGE RECONSTRUCTION AND COMPLEMENTARY SAMPLING SCHEMES

(71) Applicant: THE UNIVERSITY OF HONG KONG, Hong Kong (HK)

(72) Inventors: Ed Xuekui Wu, Hong Kong (HK); Yilong Liu, Hong Kong (HK); Yujiao Zhao, Hong Kong (HK)

(73) Assignee: THE UNIVERSITY OF HONG KONG, Hong Kong (HK)

( * ) Notice: Subject to any disclaimer, the term of this patent is extended or adjusted under 35 U.S.C. 154(b) by 86 days.

(21) Appl. No.: 17/798,572

(22) PCT Filed: Feb. 4, 2021

(86) PCT No.: PCT/CN2021/075257
§ 371 (c)(1),
(2) Date: Aug. 10, 2022

(87) PCT Pub. No.: WO2021/160018
PCT Pub. Date: Aug. 19, 2021

(65) Prior Publication Data
US 2023/0111168 A1    Apr. 13, 2023

Related U.S. Application Data

(60) Provisional application No. 62/975,794, filed on Feb. 13, 2020, provisional application No. 63/013,622, filed on Apr. 22, 2020.

(51) Int. Cl.
*G01R 33/56* (2006.01)
*G01R 33/48* (2006.01)
*G01R 33/483* (2006.01)

(52) U.S. Cl.
CPC ..... *G01R 33/5608* (2013.01); *G01R 33/4824* (2013.01); *G01R 33/4835* (2013.01)

(58) Field of Classification Search
CPC ............ G01R 33/4824; G01R 33/4835; G01R 33/5608
See application file for complete search history.

(56) References Cited

U.S. PATENT DOCUMENTS 10,823,805 B2 * 11/2020 Bydder ................. G16H 30/40
2016/0267689 A1 * 9/2016 Ye ..................... G01R 33/5611

OTHER PUBLICATIONS

Yilong Liu et al. "Calibrationless Parallel Imaging Reconstruction Using Hankel Tensor Completion (HTC)" Proc. Intl. Soc. Mag. Reson. Med. 25 (2017) 0445 (Year: 2017).*
International Search Report, Written Opinion and International Preliminary Report for International Application No. PCT/CN2021/075257 mailed on Apr. 27, 2022, 22 pages.

* cited by examiner

*Primary Examiner* — Gregory H Curran
(74) *Attorney, Agent, or Firm* — Amin, Turocy & Watson, LLP

(57) ABSTRACT

Image reconstruction methods for multi-slice and multi-contrast magnetic resonance imaging with complementary sampling schemes are provided, comprising: data acquisition using complementary sampling schemes between slices or/and contrasts) in spiral imaging or Cartesian acquisition; joint calibrationless reconstruction of multi-slice and multi-contrast data via block-wise Hankel tensor completion.

21 Claims, 10 Drawing Sheets

(A) Magnitude of coil sensitivity maps (B) Phase of coil sensitivity maps

METHODS FOR MULTI-SLICE AND MULTI-CONTRAST MAGNETIC RESONANCE IMAGING WITH JOINT IMAGE RECONSTRUCTION AND COMPLEMENTARY SAMPLING SCHEMES

This international patent application claims the benefit of U.S. Provisional Patent Application No. 62/975,794 filed on Feb. 13, 2020 and U.S. Provisional Patent Application No. 63/013,622 filed on Apr. 22, 2020, the entire contents of which are incorporated by reference for all purpose.

BACKGROUND OF THE INVENTION

Multi-Slice MRI with Spiral Trajectory Sampling

Conventional autocalibrating parallel imaging methods require autocalibrating signals (ACS) for coil sensitivity estimation. However, acquiring sufficient ACS data in multi-slice spiral MRI prolongs the acquisition window, which can lead to blurring and artifacts due to off-resonance effect. On the other hand, typical clinical scans collect multiple and consecutive 2D slices to provide volume coverage. The coil sensitivity varies smoothly within the image planes and along slice direction, and adjacent slices have similar coil sensitivity maps. With adjacent slices having interleaved sampling pattern, the ACS data can be obtained by combining central k-space lines from multiple adjacent slices. The adjacent slices also have similar image content due to the slow spatial variations of the subject, especially when the slice thickness/gap is sufficiently small. This information can be incorporated into calibrationless parallel imaging reconstruction by extending the existing low rank matrix completion approaches with tensorial expressions.

Multi-Slice MRI with Cartesian k-Space Sampling

Aforementioned multi-slice MRI is also applicable to Cartesian sampling. One can skip some phase-encoding lines according to 1D random sampling patterns in order to accelerate acquisition. The sampling pattern can be independently generated for each slice, so that the k-space sampling of adjacent slices complements each other. More effectively, multi-slice Cartesian data can be acquired with random/uniform undersampling while orthogonally alternating phase encoding directions. Phase encoding direction alternation among adjacent slices enables aliasing artifacts to occur in two orthogonal directions, thus forcing them to be more incoherent during low-rank tensor completion. This new multi-slice acquisition and reconstruction strategy effectively suppresses aliasing artifacts, leading to high accelerations without coil sensitivity calibration.

Multi-Contrast MRI

Joint image reconstruction and complementary sampling are also applicable to multi-contrast MRI. Multi-contrast MRI has been routinely used in clinical settings for its capability of providing differential diagnostic information. At present, clinical MR session often acquires independent datasets of distinct contrast at the same slice location with various pulse sequences and parameter settings. However, such multiple and independent scans are time-consuming and increase the susceptibility to motion, especially with high spatial resolution and whole-brain coverage. Therefore, accelerating the multi-contrast data acquisition is highly desired.

DETAILED DESCRIPTION OF THE INVENTION

In this invention, we propose to simultaneously reconstruct multiple adjacent slices through a block-wise Hankel tensor completion framework (MS-HTC) for spiral MRI, where the spiral data are undersampled using complementary sampling patterns across difference slices. The proposed approach can inherently exploit the coil sensitivity, spatial support, and image content similarities, and provide better performance over single-slice reconstruction with the conventional method—simultaneous autocalibrating and k-space estimation (SAKE).

In this invention, we also propose to jointly reconstruct highly undersampled multi-contrast 2D/3D k-space datasets through a novel block-wise Hankel tensor completion framework (MC-HTC). MC-HTC provides a high-order tensorial representation of multi-contrast datasets with the capability to take advantage of their highly correlated image structure, common spatial support, and shared coil sensitivity, which can lead to less residual errors especially at high acceleration.

Calibrationless Reconstruction Via Low Rank Tensor Completion

Figure 1:
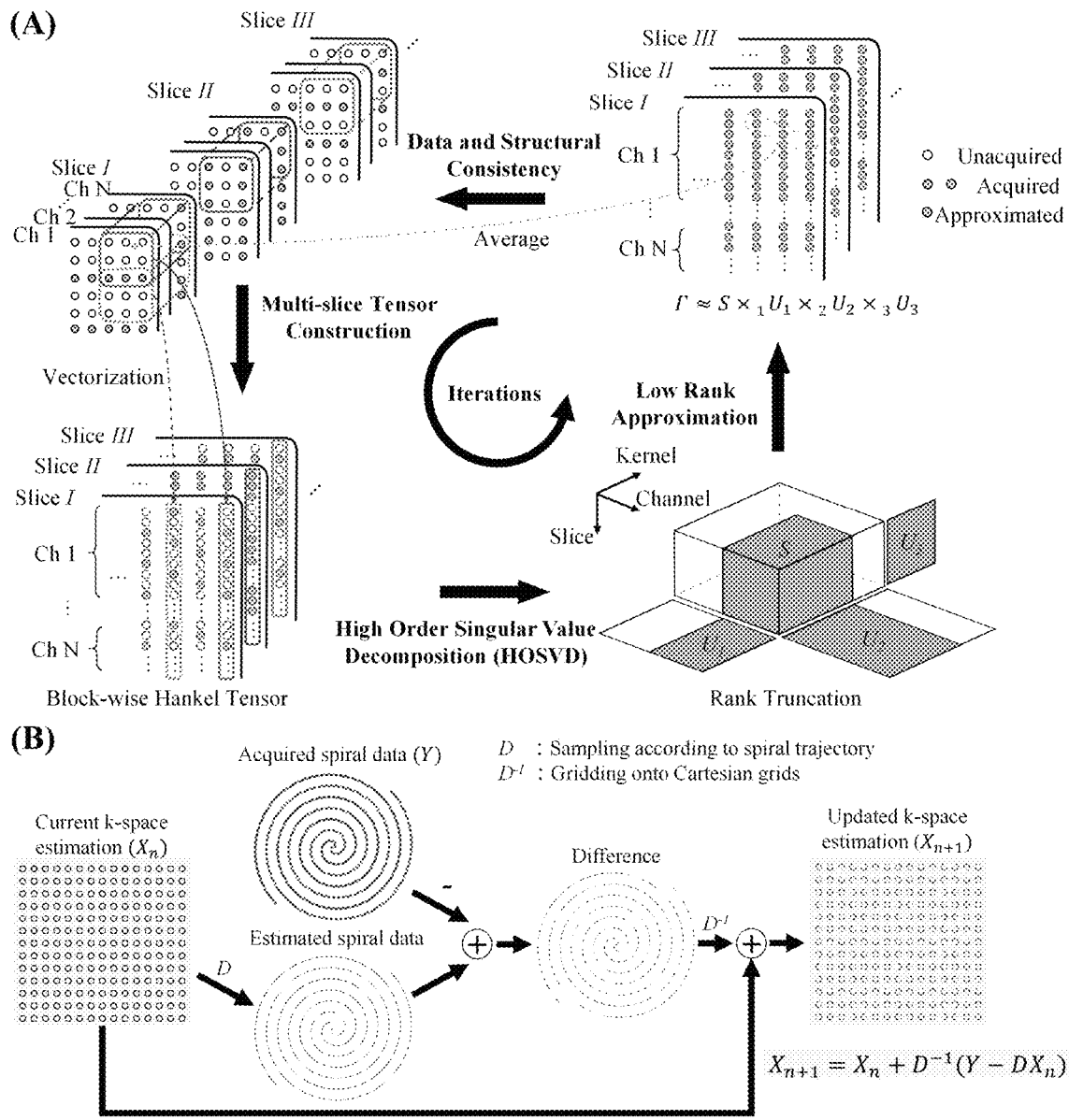
FIG. 1 (A) Diagram of the invention of joint reconstruction procedure for multi-slice spiral imaging. Each iteration consists, (1) construction of multi-slice tensor, where block-wise Hankel matrices constructed for adjacent slices having concatenated along the 3rd dimension, (2) high-order SVD (HOSVD) with 3 modes decomposition matrices $U_1$, $U_2$, $U_3$, and a core tensor S, (3) low rank approximation via rank truncation, and (4) k-space recovery from the low rank tensor, with data and structural consistency promoted. (B) Data consistency for spiral imaging, which minimizes the difference between estimated and acquired spiral data.

In this invention, calibrationless reconstruction using low rank tensor completion consists of the following steps (FIG. 1). First, multi-channel k-space data from each slice are structured into a block-wise Hankel matrix, and then stacked along a third dimension, forming a 3-order tensor, termed as multi-slice tensor in this study. As revealed in autocalibrating parallel imaging reconstruction, each k-space sample can be linearly fitted from its neighborhood within a compact kernel, and such linear dependency should be consistent across the whole k-space. This implies that a block-wise Hankel matrix should be inherently low-rank. Due to aforementioned similarities across adjacent slices, the multi-slice tensor should be even more rank-deficient compared to the Hankel matrix constructed from a single slice. Therefore, the multi-slice tensor can be decomposed using high-order SVD (HOSVD) and approximated with rank truncation.

Last, the missing k-space data are recovered from the approximated tensor, with data and structural consistency promoted. Specifically, the multi-slice tensor elements corresponding to the same k-space sample are averaged and used as k-space estimation (structural consistency). After that, data consistency is promoted as below. For Cartesian imaging, the acquired samples are simply replaced to match the acquisition. For non-Cartesian imaging (e.g. spiral imaging), the k-space data on spiral trajectories are calculated using non-uniform FFT (NUFFT), and subtracted from the acquired spiral data.

The difference is then mapped onto Cartesian grids using inverse NUFFT, and added to the current k-space estimation. This procedure minimizes the difference between estimated k-space and acquired spiral data (data consistency). Note that with such strategy, acquisition imperfections which can cause mismatch within each slice can also be compensated before NUFFT operation by considering the motion induced effect, such as phase difference in multi-shot diffusion imaging or bulk motion. These steps are repeated to update the k-space estimation iteratively until convergence.

Method and Implementation for Multi-Slice Spiral Imaging

In some embodiments, data from multiple 2D slices can be obtained with spiral imaging. The multi-slice nature of 2D acquisition allows different slices having complementary sampling pattern. In this case, the sampling for different slices complements each other by choosing the spiral shots with different rotation angles.

To demonstrate this invention, human brain data are acquired on a MRI scanner equipped with an 8-channel head coil using a multi-slice 8-shot spin-echo (SE) regular spiral sequence, with acquisition window=21 ms, TR/TE=2700/54 ms, FOV=220×220 mm$^2$, slice thickness/gap=4/1 mm, matrix size=220×220, and SPIR (spectral pre-saturation with inversion recovery) used for fat suppression. Undersampling (R=2, 4) is performed by discarding the spiral shots in an interleaved way.

Figure 2:
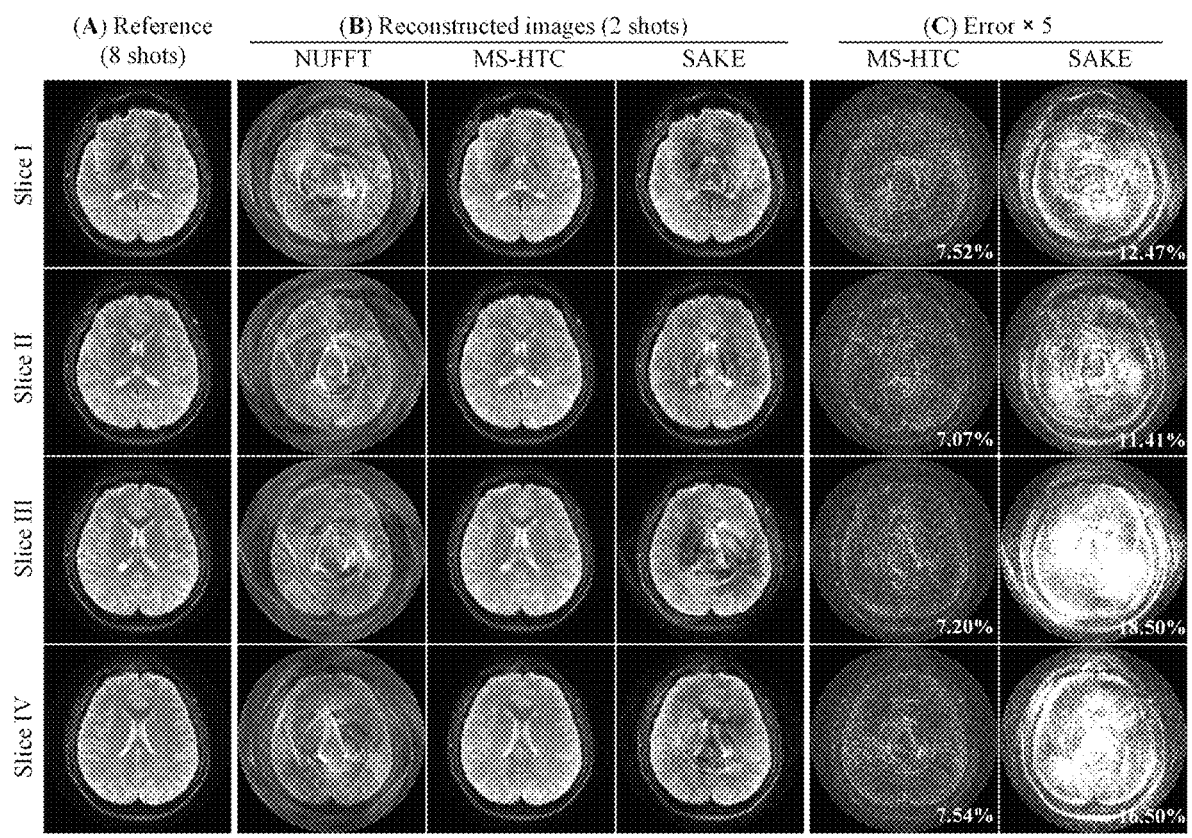
FIG. 2 Reconstruction for 8-channel T2w SE spiral data. (A) Reference images reconstructed from 8 shots using NUFFT. (B) Images reconstructed from 2 shots. (C) Error maps (×5) and root mean square error (RMSE) calculated within the brain region for each slice. NUFFT results from 2 shots suffer from strong aliasing artifacts in both brain and background regions. SAKE results have suppressed artifacts in background region, while still have distinct artifacts in brain regions. MS-HTC effectively eliminates these artifacts, and the residual error presents a noise-like pattern.
Figure 3:
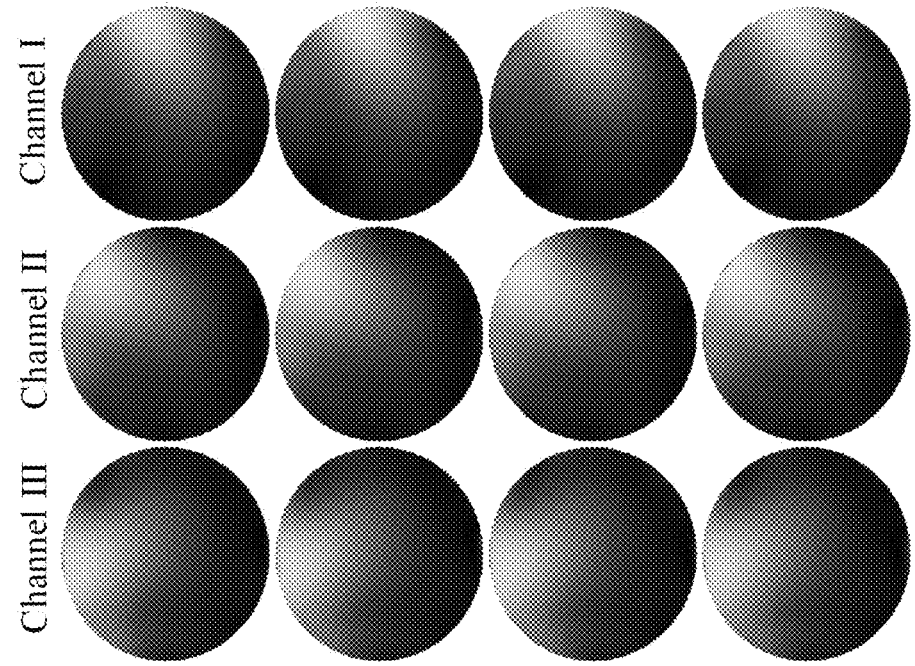
FIG. 3 (A) Magnitude and (B) phase of coil sensitivity maps corresponding to the 4 adjacent slices displayed in FIG. 2A. Each row includes the coil sensitivity maps of a selected coil for adjacent slices. The coil sensitivity maps are calculated using ESPIRiT toolbox. Note that the coil sensitivity maps vary smoothly within each slice and have similar magnitude and phase distribution across adjacent slices.
Figure 3:
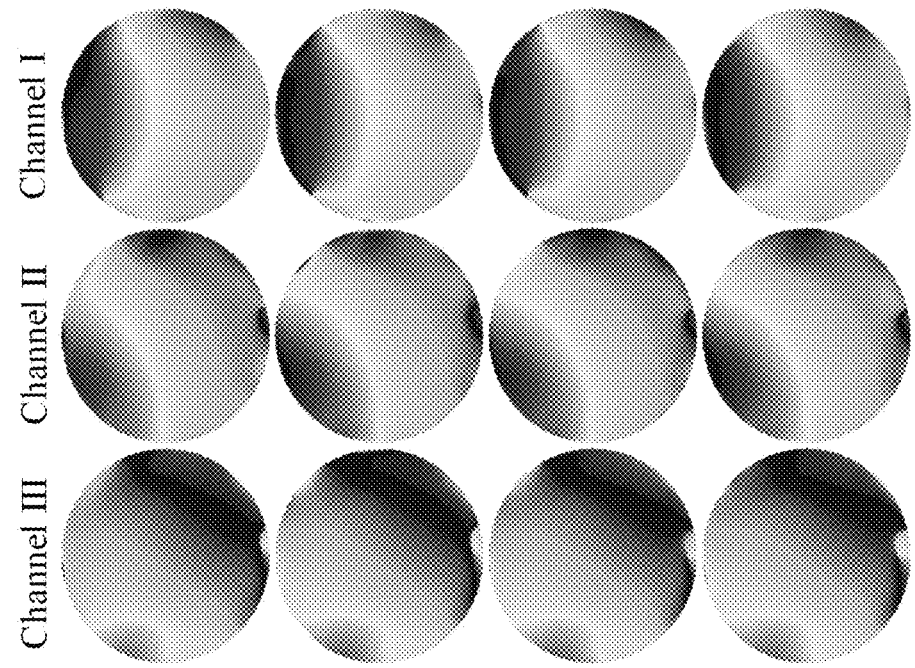
Figure 4:
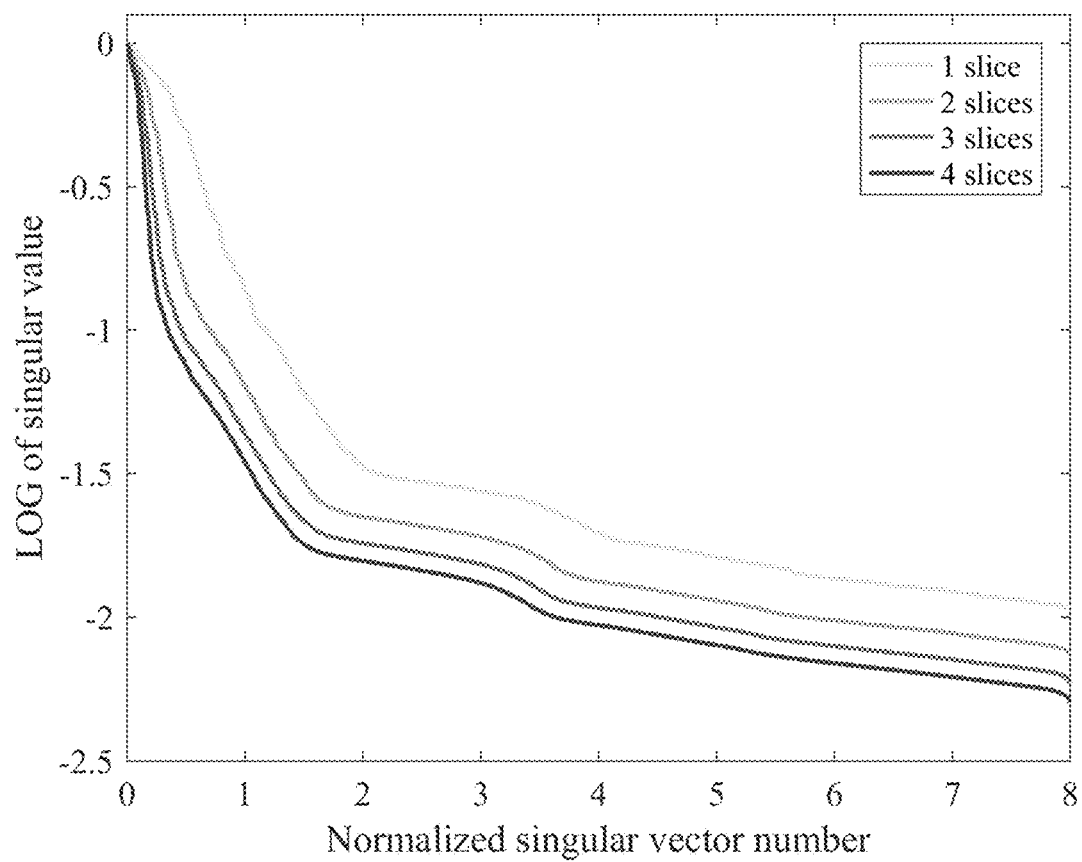
FIG. 4 Singular value distribution for multi-slice tensor constructed from different number of slices in FIG. 2A. The spiral data are gridded onto Cartesian k-space, structured into a block-wise Hankel tensor, unfolded along slice and coil dimension, and decomposed to plot the singular value distribution. With increased slice number, the constructed tensor becomes more rank-deficient. This suggests that target rank is related to the number of slices to be reconstructed together, and their similarities among adjacent slices.
Figure 5:
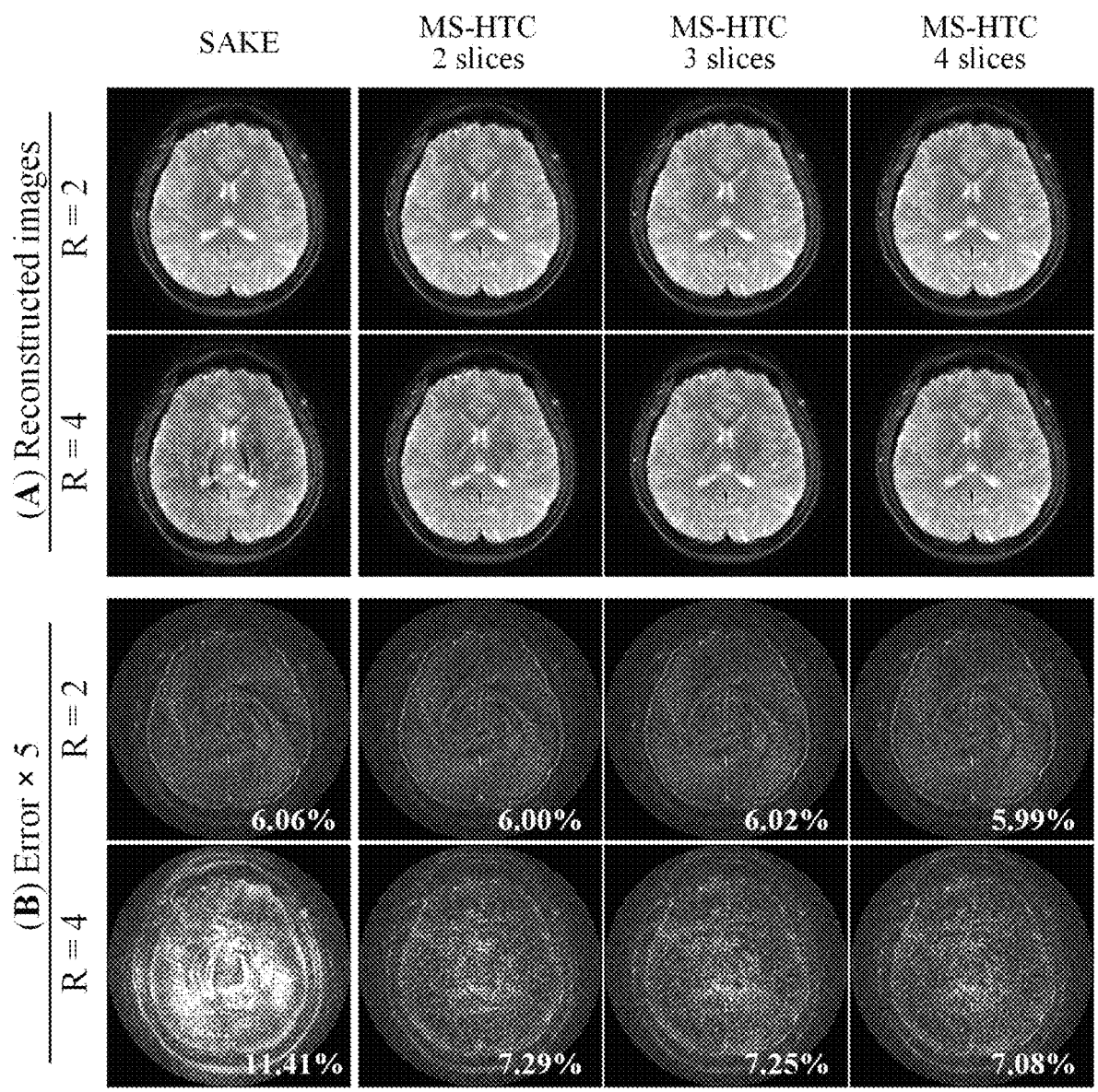
FIG. 5 Evaluation of MS-HTC and SAKE at R=2, and 4. For MS-HTC, 2, 3, and 4 adjacent slices, corresponding to Slice I-II, I-III and I-IV shown in FIG. 2A, are reconstructed simultaneously. (A) Reconstructed Slice II. (B) Error map (×5). At R=2, there is no visible artifact for both methods, and increasing the slice number for MS-HTC does not offer significant improvement. At R=4, compared to SAKE reconstruction, MS-HTC can significantly reduce residual artifacts, and the performance of MS-HTC can be further enhanced with increased slice number.
Figure 6:
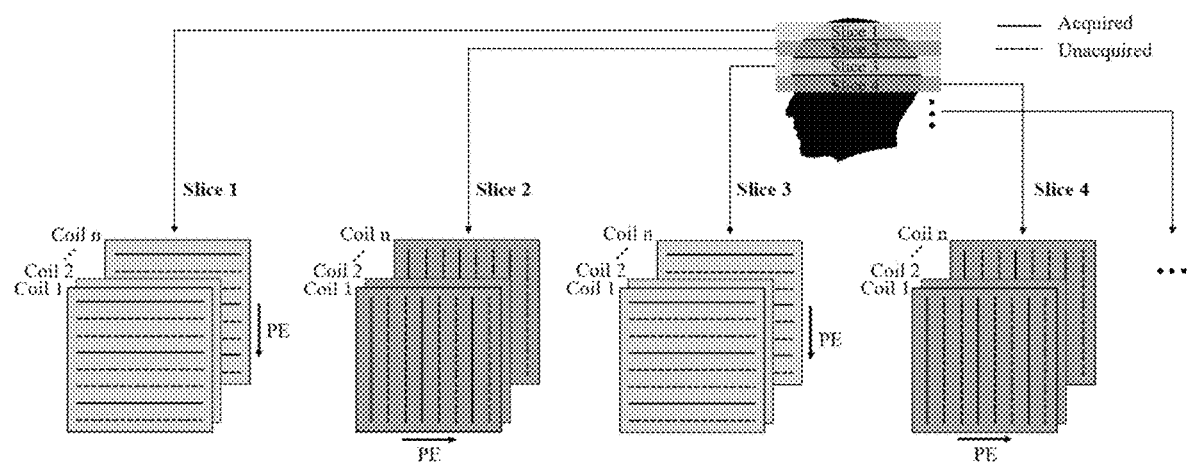
FIG. 6 Diagram of the invention of the acquisition strategy for multi-slice Cartesian imaging. The green and red slices represent the slices acquired with vertical and horizontal phase encoding (PE) directions, respectively. The solid and dashed lines represent the acquired and unacquired k-space lines. K-space data for each slice are uniformly undersampled along one phase encoding direction, while undersampled data for next adjacent slice are acquired with phase encoding along an orthogonal direction.

FIG. 2 compares the 4 adjacent slices from MS-HTC and SAKE reconstruction at acceleration factor R=4. These slices have similar coil sensitivity maps in terms of their magnitude and phase (FIG. 3). Fully sampled and four-fold undersampled data are also directly reconstructed using NUFFT. Direct reconstruction from four-fold undersampled data suffers from severe aliasing artifacts, which cannot be fully suppressed with SAKE. With 4 slices reconstructed together using MS-HTC, these artifacts can be significantly eliminated. With increased number of slices being reconstructed together, the constructed tensor is more rank-deficient (FIG. 4), which can lead to improved reconstruction performance, especially at high accelerations. As shown in FIG. 5, at R=2, MS-HTC does not have major advantage over SAKE. However, at R=4, MS-HTC results have significantly reduced residual artifacts, and 4-slice reconstruction can provide better performance over 2-slice/3-slice reconstruction.

Method and Implementation for Multi-Slice Cartesian Imaging

In some embodiments, data from multiple 2D slices can be obtained with Cartesian acquisition, and adjacent slices can be acquired with alternating phase encoding directions.

To demonstrate this invention, human brain data from healthy volunteers are acquired on a MRI scanner using an 8-channel coil. 2D fast spin echo (FSE) was applied to acquire T2-weighted and T1-weighted inversion recovery (IR) datasets with TR/TE=3000/86 ms and TR/TE/TI=2000/

20/800 ms, respectively. Both datasets are acquired with slice thickness/gap=4/1 mm. K-space data are retrospectively undersampled with the proposed acquisition strategy. The kernel window size for Hankel matrix construction is 6×6. Normalized root-mean-square errors (NRMSE) are measured to assess reconstruction performance.

Figure 7:
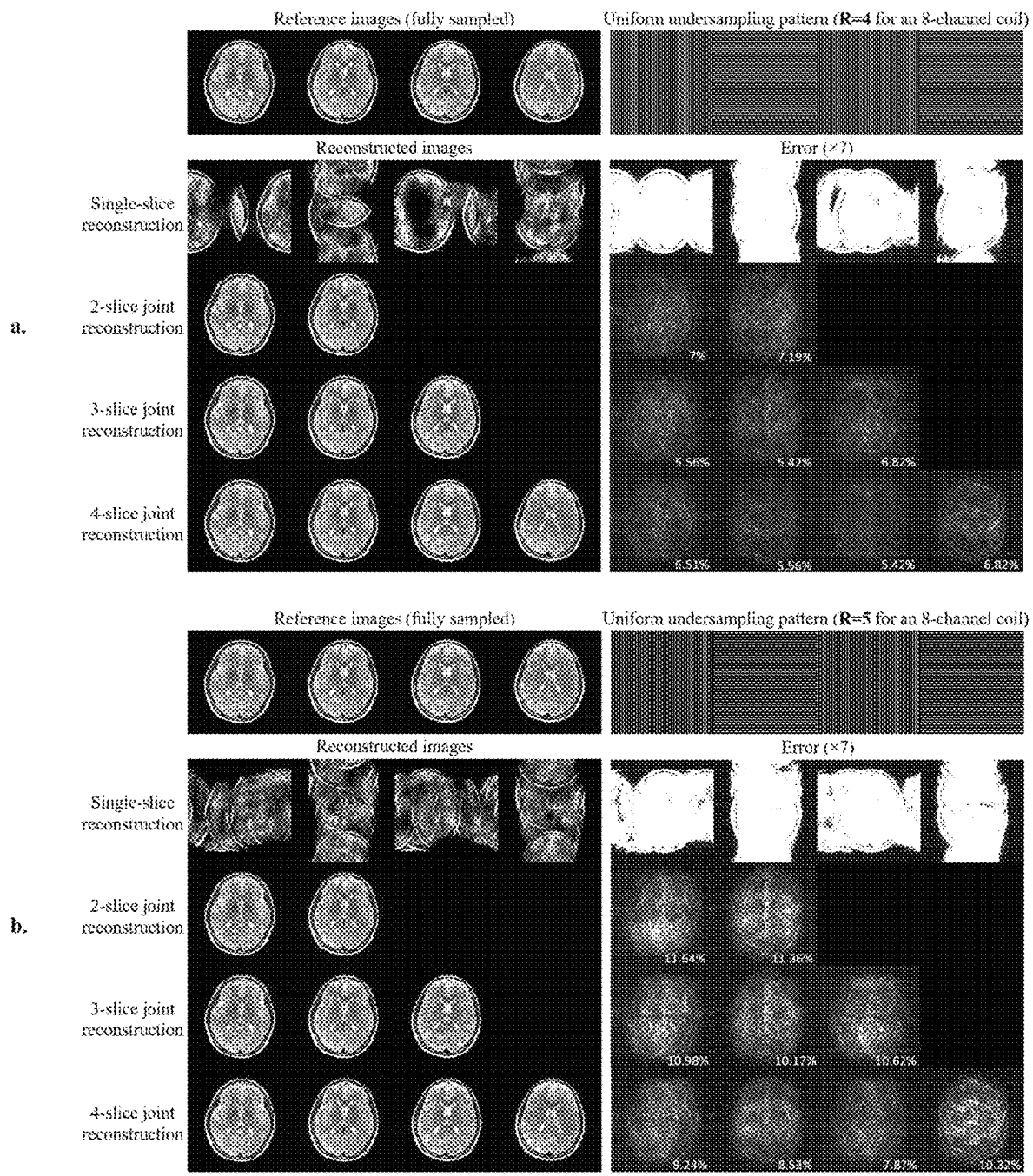
FIG. 7 Demonstration of the invention with acceleration factors R=4 (a) and R=5 (b). T2-weighted data were acquired with an 8-channel coil, and uniformly undersampled with orthogonally alternating phase encoding directions among adjacent slices. The method effectively suppresses aliasing artifacts and achieved good reconstruction performance. The multi-slice undersampled data are also independently reconstructed through simultaneous autocalibrating and k-space estimation (SAKE). However, conventional SAKE fails due to the lack of central k-space data.
Figure 8:
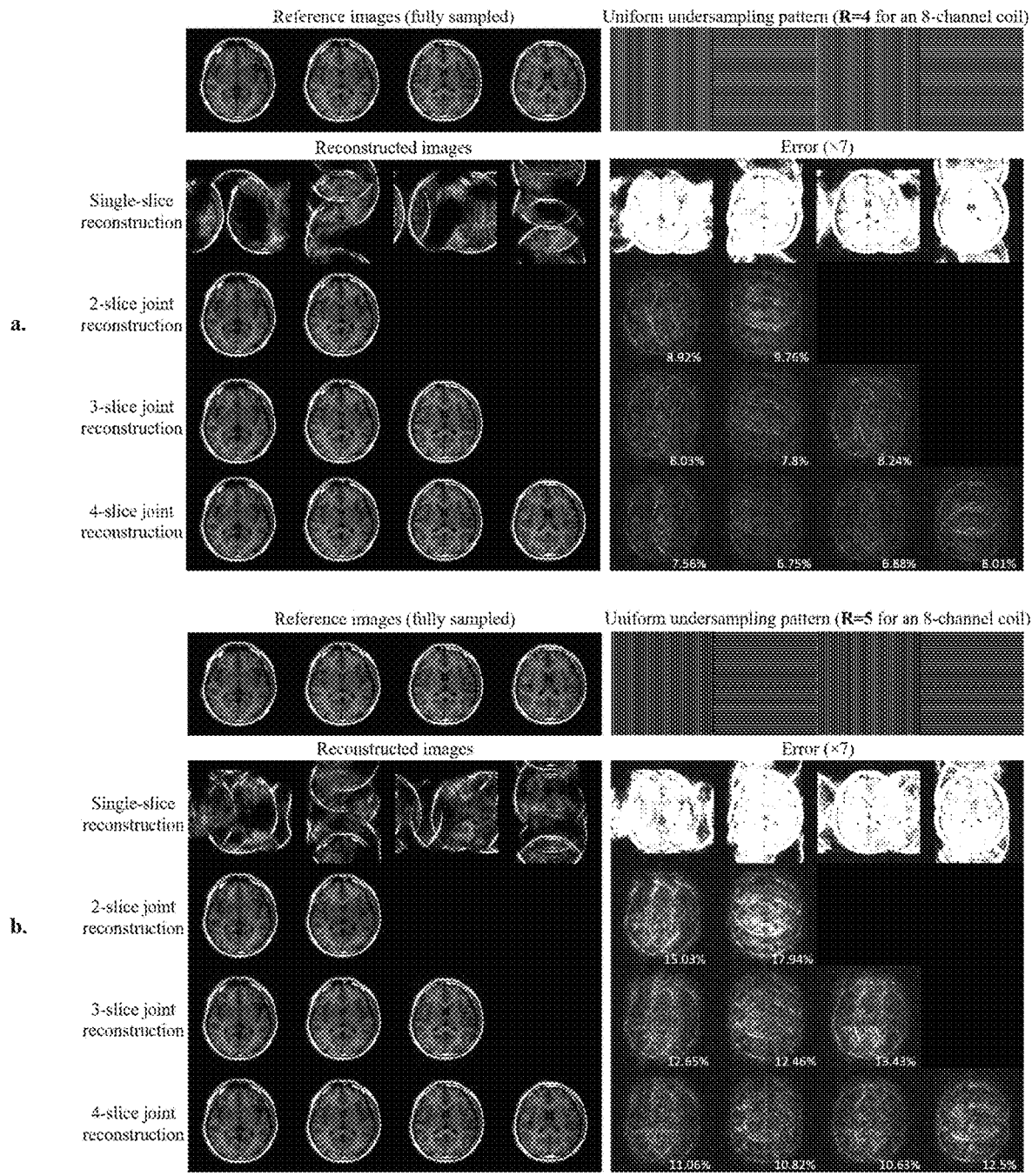
FIG. 8 Demonstration of the invention with acceleration factors R=4 (a) and R=5 (b). Again T1-weighted IR data are acquired with an 8-channel coil, and uniformly undersampled with orthogonally alternating phase encoding directions among adjacent slices. The method effectively suppresses aliasing artifacts and achieved much better reconstruction performance than traditional SAKE.
Figure 9:
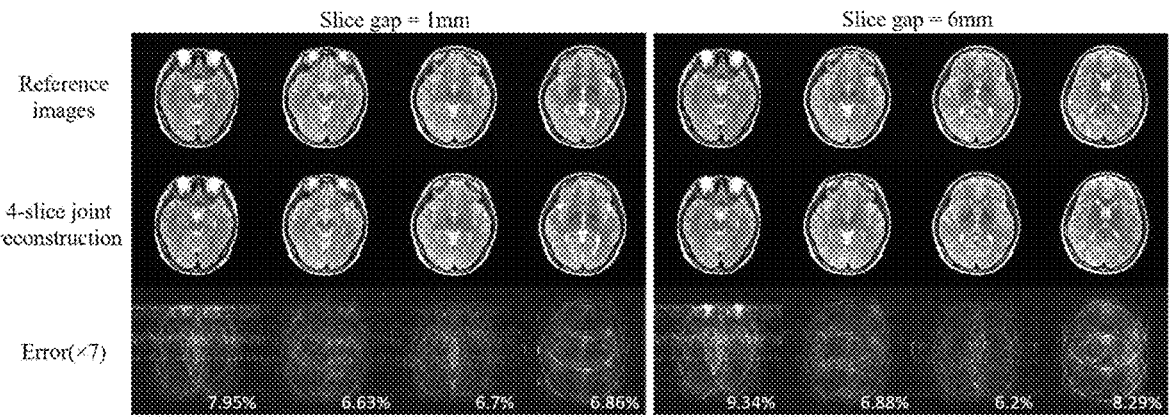
FIG. 9 Demonstration of the inventions with two different slice gaps (i.e., different extents of similarities in coil sensitivities and image contents among adjacent slices). T2-weighted data are acquired with an 8-channel coil, and uniformly undersampled with orthogonally alternating phase encoding directions with R=4. The reconstruction error increases with slice gap due to the reduction of correlations.

FIG. 7 and FIG. 8 present reconstruction results for T2-weighted and T1-weighted IR data with different acceleration factors. The undersampled data are also independently reconstructed through single-slice based reconstruction method (simultaneous autocalibrating and k-space estimation, SAKE[2]). The strategy achieves a clear improvement than single-slice based method in suppressing aliasing artifacts. The improvement increases with the number of slices, in terms of less reconstruction error and smaller NRMSE. FIG. 9 demonstrates that our proposed method utilized correlations across slices. The reconstruction error increases with slice gap due to the reduction of similarities in coil sensitivities and image contents, as expected.

Method and Implementation for Multi-Contrast Imaging

In some embodiments, data with different contrasts can be acquired with identical geometry and complementary sampling patterns.

Reconstruction performance is demonstrated by using the raw 2D Cartesian brain datasets, collected on a MRI scanner using an 8-channel head coil. Fully sampled datasets of four typical MRI contrasts are acquired with identical locations. For T1-weighted (T1W) acquisition, 2D fast field echo (FFE) is used with TE/TR=4/519 ms, and flip angle=80°. For T2-weighted (T2W), fluid-attenuated inversion recovery (FLAIR), and T1-weighted inversion recovery (IR) acquisitions, 2D fast spin echo (FSE) is used with TE/TR=86/3000 ms, TE/TI/TR=135/2500/8000 ms, and TE/TI/TR=20/800/2000 ms, respectively. Other imaging parameters are acquisition matrix size=300×300, image matrix 200×200 by cropping, image FOV=240×240 $mm^2$, and slice gap/thickness=¼ mm for all datasets. Multi-contrast k-space data are retrospectively undersampled with several undersampling schemes. By discarding some phase-encoding lines according to the acceleration factor (R=4), 1D random undersampling patterns are independently generated for each contrast. Furthermore, the aforementioned sampling scheme with alternating phase-encoding direction among different contrasts is used while keeping 1D uniform undersampling patterns for each contrast.

Figure 10:
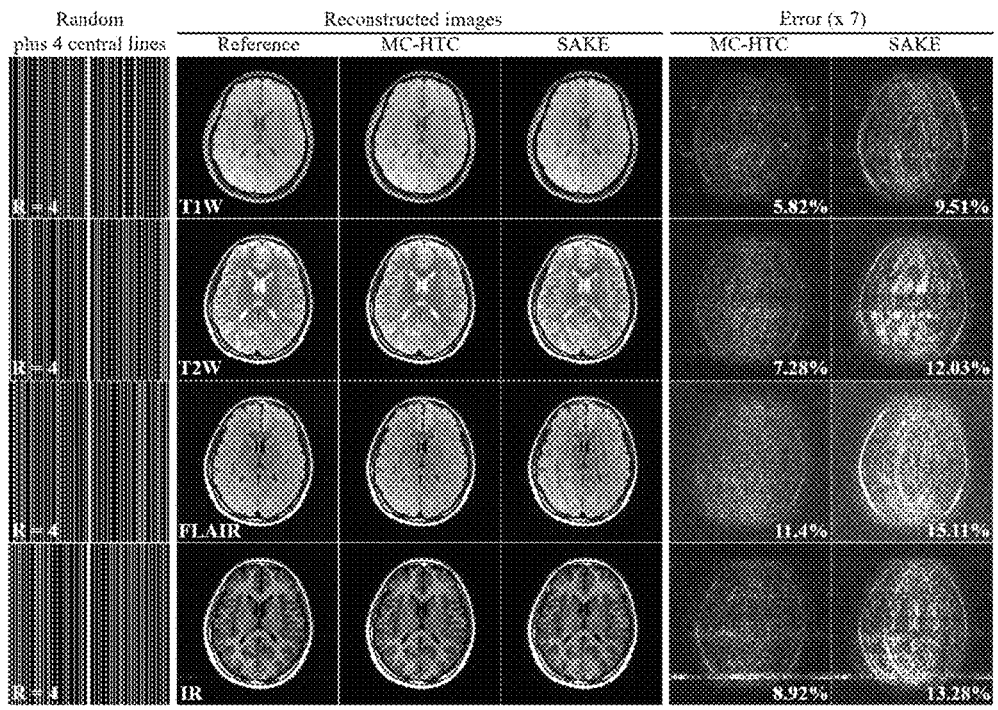
FIG. 10 Demonstration of the invention for 8-channel T1W, T2W, FLAIR, and IR datasets of identical image geometry with 1D random undersampling patterns. For each contrast, the undersampling pattern is independently generated with four additional central k-space lines. MC-HTC produces relatively clear images with about 30% reduction in NRMSE for all contrasts.
Figure 11:
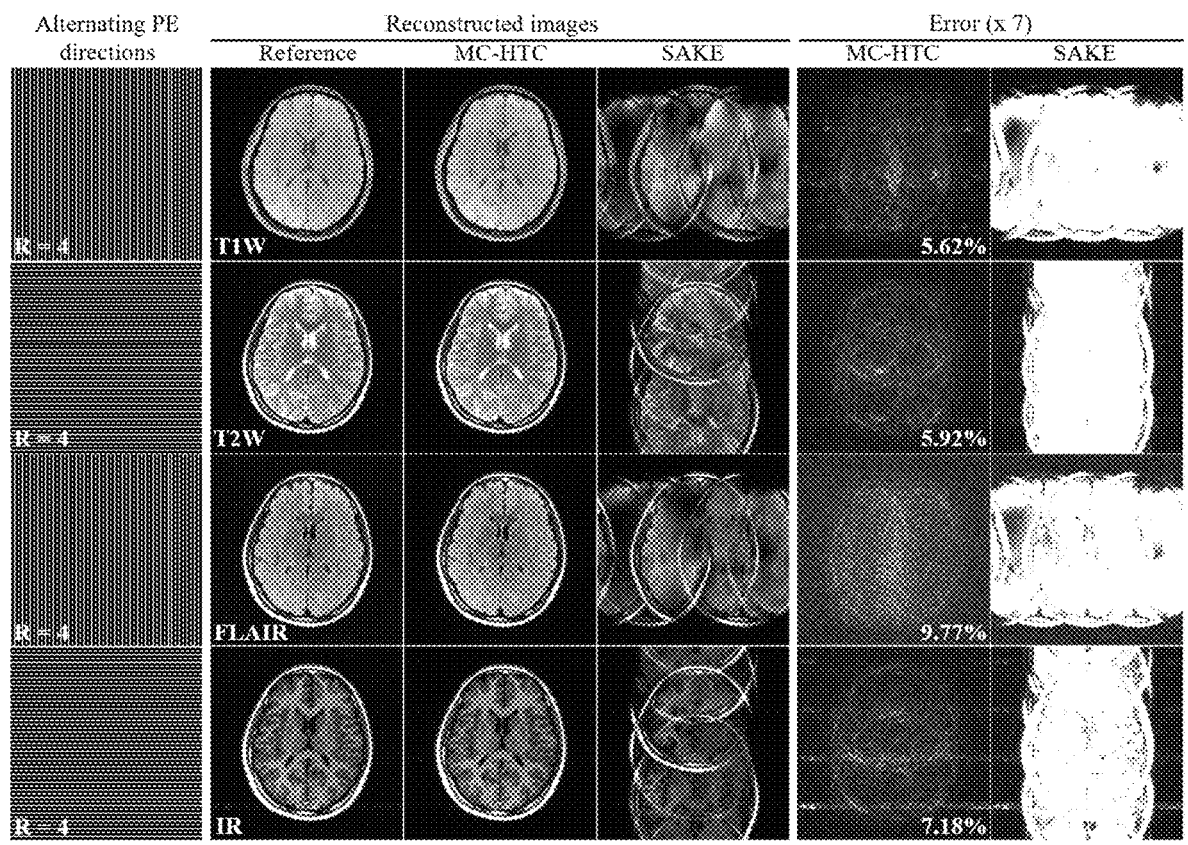
FIG. 11 Demonstration of the invention for completely uniform undersampling patterns (R=4). SAKE reconstruction without addition central k-space lines totally fails to remove extremely coherent aliasing, whereas MC-HTC with the strategy of alternating phase-encoding directions still performs well with only a slight NRMSE increase. Number of coil channels is eight.

Reconstruction results with 1D random undersampling patterns are shown in FIG. 10 SAKE reconstruction of each contrast exhibits severe residual aliasing, whereas MC-HTC joint reconstruction significantly reduces such artifacts by nearly 30% in NRMSE. Apart from aliasing, SAKE also shows noticeable noise-like residuals associated with its vulnerability to SNR penalty at high acceleration. In contrast, the noise-like residuals are effectively suppressed in MC-HTC joint reconstruction, especially for low SNR FLAIR images. FIG. 11 further demonstrates the applicability of MC-HTC joint reconstruction to the completely uniform undersampling patterns (i.e., with no additional central k-space lines) while alternating the phase-encoding directions among contrasts. Conventional individual SAKE reconstruction cannot handle such highly coherent undersampling pattern here, yet MC-HTC yields high-quality images.

What is claimed is:

1. A method for MRI reconstruction of multi-slice magnetic resonance imaging with a complementary sampling scheme, comprising:

data acquisition with the complementary sampling scheme across multiple adjacent slices, resulting in acquired data;

promoting structural consistency by averaging multi-slice tensor elements corresponding to the same k-space sample and using the output as a k-space estimation; and jointly reconstructing multiple image slices using block-wise Hankel tensor completion.

2. The method of claim 1, wherein the acquired data is multi-channel 2D data.

3. The method of claim 1, wherein the jointly reconstructing comprises:
a) block-wise Hankel tensor construction;
b) tensor decomposition;
c) low-rank approximation;
d) promoting data and structural consistency; and
e) repeating steps (a-d), and iteratively updating a corresponding k-space resulting in a k-space update.

4. The method of claim 3, further comprising:
constructing a block-wise Hankel tensor by structuring multi-channel k-space data from each slice of the multiple image slices into respective block-wise Hankel tensors, and stacking the block-wise Hankel tensors along a third dimension to form a $3^{rd}$ order multi-slice tensor.

5. The method of claim 3, further comprising:
decomposing the tensor using high-order singular value decomposition (HOSVD) or canonical polyadic decomposition (CPD).

6. The method of claim 3, further comprising:
promoting tensor low-rank using rank truncation or singular value shrinkage.

7. The method of claim 3, further comprising:
promoting data consistency by replacing a k-space estimation with acquired data for Cartesian imaging.

8. The method of claim 3, further comprising:
promoting, for non-Cartesian imaging, the data consistency by a combination of:
calculating k-space data on non-Cartesian trajectories using non-uniform FFT (NUFFT);
subtracting the k-space data from the acquired data resulting in revised data;
mapping the difference, between the acquired data and the revised data, onto Cartesian grids using inverse NUFFT; and
adding the difference to the current k-space estimation.

9. The method of claim 3, further comprising:
stopping the iteration procedures when reaching a predefined maximum iteration or when the k-space update is under a predefined threshold.

10. The method of claim 1, wherein sampling patterns across multiple adjacent slices complement one other.

11. The method of claim 10, wherein a sampling pattern, of the sampling patterns, comprises Cartesian trajectories with adjacent slices sampling different k-space lines according to 1 D random distribution.

12. The method of claim 10, wherein a sampling pattern, of the sampling patterns, comprises Cartesian trajectories with adjacent slices sampling uniform and interleaved k-space lines, and a few central k-space lines fully sampled.

13. The method of claim 10, wherein a sampling pattern, of the sampling patterns, comprises Cartesian trajectories with adjacent slices have alternating phase encoding directions.

14. The method of claim 10, wherein a sampling pattern, of the sampling patterns, comprises spiral trajectory with spiral interleaves for adjacent slices having different rotation angles.

15. The method of claim 10, wherein a sampling pattern, of the sampling patterns, comprises radial trajectories with radial lines for adjacent slices having different rotation angles, and which follows a golden angle scheme.

16. The method of claim 1, further comprising:
   acquiring with identical geometry and the complementary sampling scheme, MR data with multiple contrasts; and
   jointly reconstructing the MR data.

17. The method of claim 16, wherein the acquired MR data comprises multi-channel multi-slice 2D data.

18. The method of claim 16, wherein the jointly reconstructing is executed for multiple adjacent slices with multiple contrasts.

19. The method of claim 16, wherein the acquired data comprises multi-channel 3D data.

20. The method of claim 16, further comprising:
   acquiring a set of the MR data with different TR/TE by employing MR parameter mapping.

21. The method of claim 16, further comprising:
   reconstructing a temporal MR data set of the MR data in cardiac cine or perfusion imaging.

\* \* \* \* \*